United States Patent [19]

Turner et al.

[11] Patent Number: 5,330,101
[45] Date of Patent: Jul. 19, 1994

[54] MATERIAL CHANGEOVER AND ANTI-SKIN OVER SYSTEM

[75] Inventors: James J. Turner, Amherst; William E. Donges, Wellington, both of Ohio

[73] Assignee: Nordson Corporation, Westlake, Ohio

[21] Appl. No.: 954,313

[22] Filed: Sep. 30, 1992

Related U.S. Application Data

[63] Continuation-in-part of Ser. No. 831,873, Feb. 6, 1992, abandoned.

[51] Int. Cl.⁵ .............................................. B05B 15/02
[52] U.S. Cl. .................................. 239/112; 239/121; 427/96
[58] Field of Search ............... 239/106, 112, 120, 121, 239/104, 1; 427/96

[56] References Cited

U.S. PATENT DOCUMENTS

| | | | |
|---|---|---|---|
| 3,403,695 | 10/1968 | Hopkins | 137/240 |
| 3,405,092 | 6/1969 | Kock | 239/112 |
| 3,672,570 | 6/1972 | Scarbrough et al. | |
| 3,870,233 | 3/1975 | Wilhelm et al. | |
| 4,485,840 | 12/1984 | Erwin | 239/112 |
| 4,534,802 | 8/1985 | Gates et al. | 239/112 |
| 4,627,465 | 12/1986 | Kolibas et al. | |
| 4,657,047 | 4/1987 | Kolibas | |
| 4,695,482 | 9/1987 | Weiswurm | 427/96 |
| 4,753,819 | 6/1988 | Shimada | |
| 4,830,055 | 5/1989 | Kolibas | |
| 4,830,882 | 5/1989 | Ichinose et al. | |
| 4,880,159 | 11/1989 | Coffey | 239/112 |
| 4,880,663 | 11/1989 | Shimada | |
| 4,881,563 | 11/1989 | Christian | 239/106 |
| 4,913,930 | 4/1990 | Getson | 427/96 |
| 5,019,409 | 5/1991 | Wesling | 427/96 |

Primary Examiner—Andres Kashnikow
Assistant Examiner—Christopher G. Trainor
Attorney, Agent, or Firm—Wood, Herron & Evans

[57] ABSTRACT

Apparatus for applying a conformal coating to circuit boards which includes fluid circuits for applying coating material, solvent and drying circuits for cleaning the coating material circuits, and both a solvent dock and a nitrogen dock for the coating application nozzle to prevent skin-over of various coating materials thereon between coatings. Changeover controls and circuits for changing coating materials are disclosed, as well as solvent dump and replenishment circuits for the applicator nozzle solvent dock, and a supply line and cup for the alternative nitrogen dock.

62 Claims, 3 Drawing Sheets

MATERIAL CHANGEOVER AND ANTI-SKIN OVER SYSTEM

This application is a continuation-in-part of application Ser. No. 07/831,873, filed Feb. 6, 1992, now abandoned, entitled MATERIAL CHANGEOVER AND ANTI-SKIN OVER SYSTEM, in the name of James J. Turner, which is assigned to the Nordson Corporation, the assignee of this present continuation-in-part application.

This invention relates to apparatus and methods for coating circuit boards and more particularly to a printed circuit board coating system utilizing different coating materials including moisture curable coating materials and preventing skin-over of residual material on a coating applicator between coating runs.

In the manufacture of printed circuit boards, a moistureproof insulator film is applied to protect the circuit boards from moisture, electric leakage and dust. Preferably, the moistureproof insulator films are known as conformal coatings, such as acrylic, polyurethane, or epoxy synthetic resins dissolved in a volatile solvent. One conformal coating found satisfactory is available from Humiseal Division, Columbia Chase Corp., Woodside, N.Y., under the trademark "HumiSeal 1B31". When applied to clean printed circuit boards, an insulative resin film of uniform thickness, without pinholes is formed as the solvent evaporates on a continuous basis. While many different moisture cure and secondary moisture cure materials may be used with the present invention, the following specific examples of such materials are illustrative. One satisfactory moisture cure coating material may be obtained from ShinEtsu Co. under product no. X-831-008. A satisfactory secondary moisture cure coating material may be obtained from Locktite Corp. under product no. 4190.

In the past, a number of methods have been used to apply coatings of moistureproof insulators to printed circuit boards. One such apparatus is described in pending U.S. patent application Ser. No. 07/510,001 filed Apr. 17, 1990, now U.S. Pat. No. 5,141,165 and entitled "SPRAY GUN WITH FIVE AXIS MOVEMENT" and owned by assignee of this application. Such prior pending application is herewith expressly incorporated herein by reference. Other related apparatus is described in pending U.S. patent application Ser. No. 07/659,855, filed Feb. 22, 1991, now U.S. Pat. No. 5,188,669 and entitled "CIRCUIT BOARD COATING METHOD AND APPARATUS WITH INVERTING PALLET SHUTTLE", also owned by assignee of this application. Such prior pending application is herewith expressly incorporated herein by reference.

Methods for applying moistureproof coatings to printed circuit boards are also described in U.S. Pat. Nos. 4,753,819, issued Jun. 28, 1988, and entitled "METHOD FOR APPLYING A MOISTUREPROOF INSULATOR COATING ON PACKAGED CIRCUIT BOARDS", and 4,880,663, issued Nov. 14, 1989, entitled "METHOD FOR APPLYING A MOISTUREPROOF INSULATIVE COATING TO PRINTED CIRCUIT BOARDS USING TRIANGULAR OR DOVETAIL SHAPED LIQUID FILMS EMITTED FROM A FLAT-PATTERN NOZZLE". Both of these are owned by assignee of this application and both of these patents are herewith expressly incorporated herein by reference.

Such prior systems generally include a coating applicator or spray gun mounted on a robot arm, for example, to move the gun in predetermined directions over the printed circuit board for deposition of the coating. Alternatively, the boards are moved in a predetermined manner beneath the applicator, or the boards and guns are each moved relative to the other in a predetermined manner for coating.

Whenever the system is turned off or shutdown for any considerable time period, or whenever it is desired to change over to a different conformal coating material, it is necessary to flush with a solvent the coating material supply and application equipment, including lines and guns.

Presently, this flushing requires disconnection and reconnection of various air and fluid lines. The down time necessary for the change over or shut down decreases efficiency and may exhaust solvent or coating material vapors.

Moreover, when the system is shut down, or when the applicator gun sits idle between coating runs or coating material change over, residual material at the end of the nozzle of the applicator gun is exposed to air and will tend to cure. In the case of moisture cure and secondary moisture cure coating materials moisture in the air will tend to cure these materials when the applicator gun sits idle. If such coating materials cure then the applicator gun may skin over. When a coating process is restarted, such skin over causes application inconsistencies and pattern distortion at the beginning of the coating operation, and may even clog the nozzle.

Accordingly, it is desirable to provide apparatus and methods for automatically flushing circuit board coating material from application equipment on shut down, idling between runs or change over.

It is also desirable to provide apparatus and methods for preventing curing and skin over of residual coating material exposed to air or air containing moisture at the nozzle end of the applicator gun when the gun is idled.

To these ends, a preferred embodiment of the invention includes a controlled network of material and solvent lines and valves for delivering material to the gun for coating, for delivering solvent and drying air to the gun and recirculation lines for flushing, and for selectively delivering at least one different conformal coating material to the gun for change over, all automatically and without disconnection and reconnection of lines.

In addition, a first embodiment of the invention includes a docking cup into which the gun nozzle is docked when the gun is idled, and which is automatically filled with solvent and voided according to an automatic control.

It has been discovered that solvents may contain enough moisture to cure coating materials consisting of moisture cure or secondary moisture cure materials. Thus, curing of residual moisture cure and secondary moisture cure materials may occur when using the solvent docking cup.

A second embodiment of the invention is thus directed to prevention of gun clogging and skin-over where moisture cure coatings are used. As contrasted to the first embodiment this embodiment instead uses a docking cup containing a dry gas into which the gun nozzle is docked when the gun is idled. A preferred gas is nitrogen. The nitrogen docking cup may be used to prevent skin-over of such moisture cure and secondary moisture cure materials.

In the first embodiment of the invention three control switches are provided to selectively control a plurality of solenoids, air actuators, valves and timers to accomplish these objectives. Two coating material sources and a solvent source are automatically connected via a network of lines or conduits controlled by the switches, solenoids, actuators, valves and timers to automatically control coating starting and stopping, flushing, change over and anti-skin over. These switches can be manually controlled or controlled by a programmable or other computer driven control system to control the system.

In the second embodiment of the invention the third switch and accompanying timers and valves which control the filling and dumping of the solvent docking cup are eliminated. Instead, the cup receives a continuous flow of nitrogen controlled by a needle valve connected to a line running between a nitrogen supply tank and the docking cup.

Accordingly, the present invention automatically accomplishes solvent flushing and change over, eliminating a previously time consuming operation, and prevents material skin-over at the nozzle. Production efficiency is increased and operator exposure to solvent and coating material fumes is limited. The invention improves material utilization and reduces the amount of waste material generated.

These and other objectives and advantages will become even more readily apparent from the following description of the preferred embodiments of the invention and from the drawings in which.

SPECIFICATION

Figure 2:
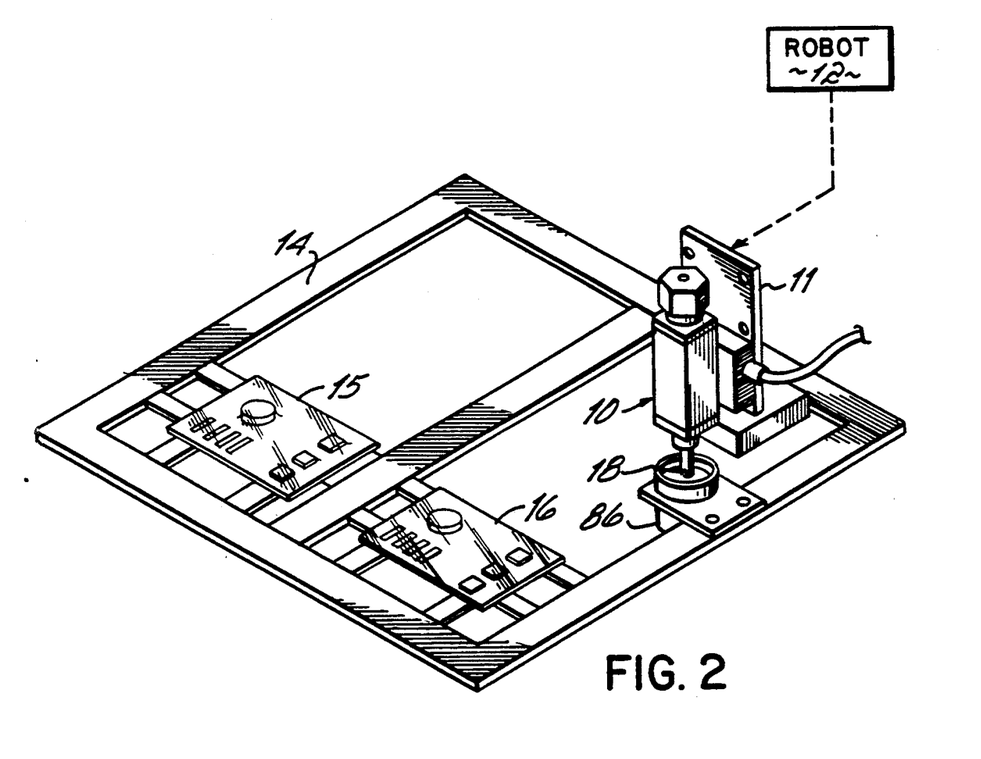
FIG. 2 is a diagrammatic perspective view of a printed circuit board coating system with an applicator gun nozzle docked in an anti-skin over solvent docking cup according to a first embodiment of the invention.

Turning now to the drawings and particularly first to FIG. 2 thereof, there is shown diagrammatically an applicator or spray gun 10 mounted via a bracket 11 to a robot 12. The gun 10 is mounted over and above a frame 14 adapted to carry a plurality of printed circuit boards 15, 16 for example. The gun 10 and the frame 14 are movable relative to each other and the gun 10 is operable in use to apply coating to the circuit boards 15, 16, as the gun and/or the frame move in a predetermined pattern. The gun 10 has a nozzle 18 for depositing a pattern 20 of coating material on the circuit boards.

It will be appreciated that the invention is particularly useful for applying a conformal coating to a printed electric circuit board and that neither the mechanisms for mounting or moving the gun, nor for mounting or moving the circuit board, comprise a part of this invention. In this regard, the pending patents and patent applications incorporated herein by reference are referred to as providing background information in connection with various processes and apparatus for applying coatings to printed circuit boards.

THE DISPENSING AND FLUSHING SYSTEM

Figure 1:
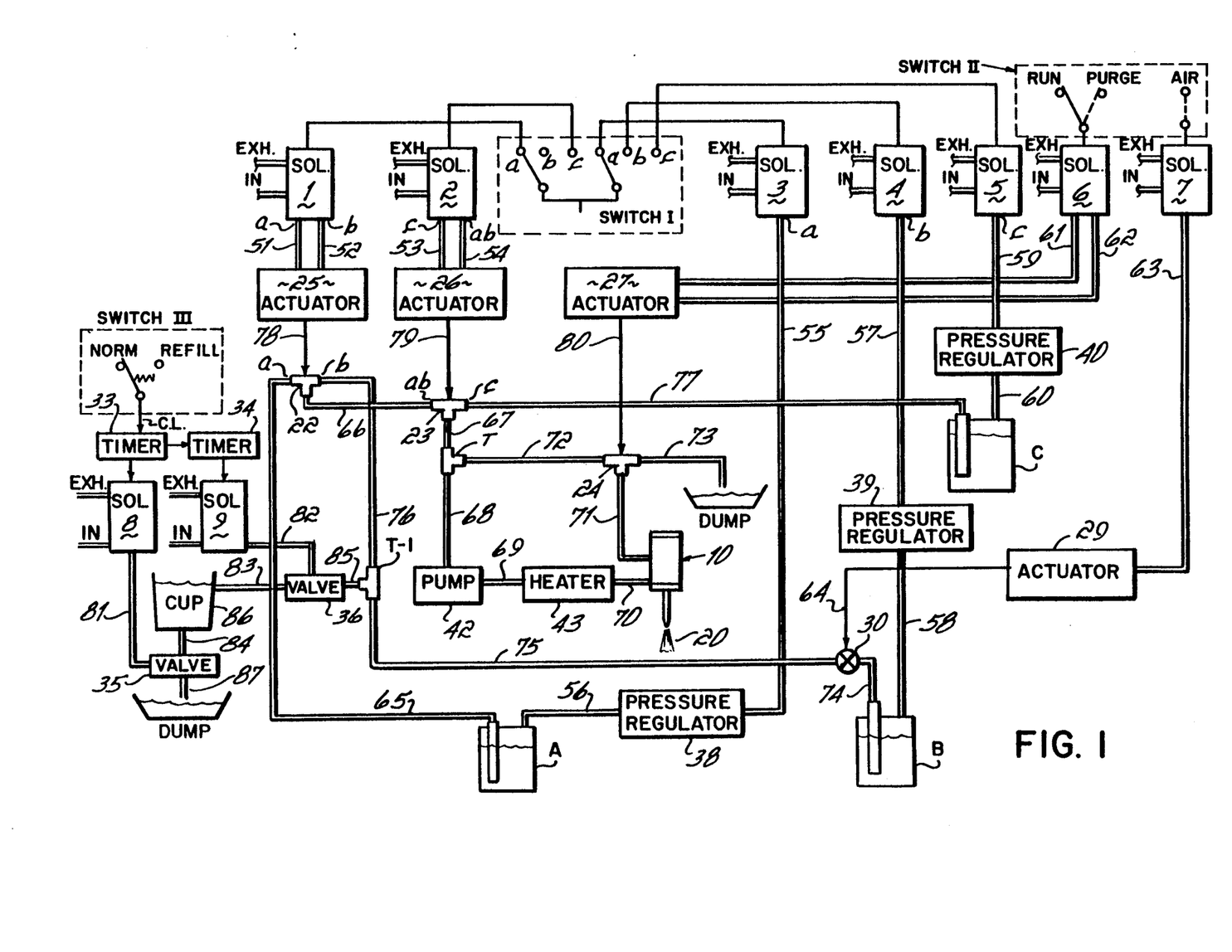
FIG. 1 is a diagrammatic illustration of a first embodiment of a printed circuit board coating system including an anti-skin over solvent docking cup according to the invention.
Figure 3:
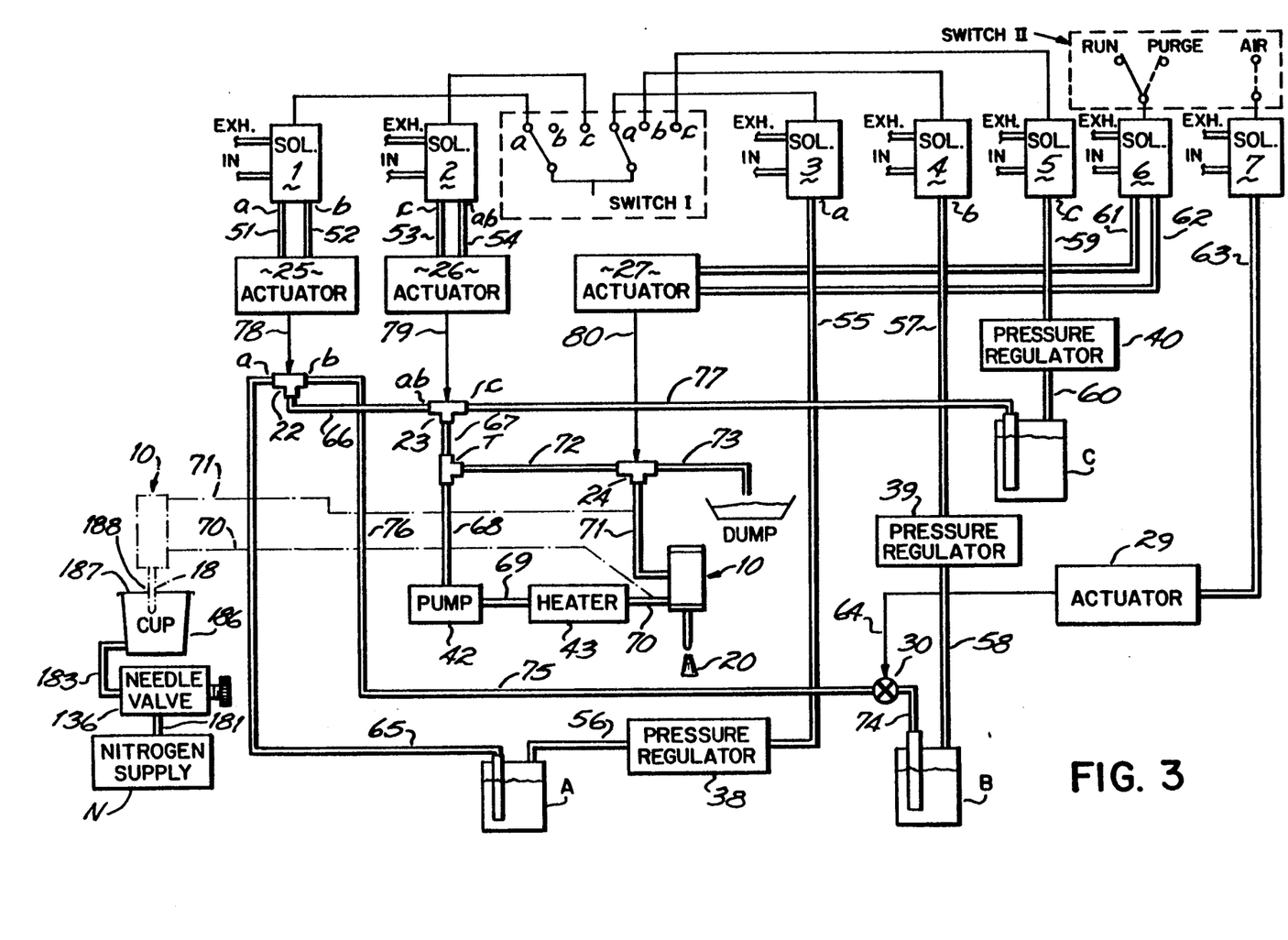
FIG. 3 is a diagrammatic illustration of a second embodiment of a printed circuit board coating system including a nitrogen filled docking cup according to another embodiment of the invention.

Referring now to FIGS. 1 and 3, there is illustrated diagrammatically a preferred embodiment of the invention, useful for flushing the various coating application equipment, for changing coating materials, and for preventing skin-over of residual material on the gun nozzle. Like numerals in each figure represent like elements of the invention. It should be noted that the dispensing and flushing system is identically shown on the righthand side of FIGS. 1 and 3 beginning at solenoid 1. The design of the respective docking cups, shown on the lefthand side of FIGS. 1 and 3, will be described later in detail.

The dispensing and flushing apparatus disclosed in FIGS. 1 and 3 includes solenoids 1 through 7. Solenoids 1 through 5 are connected for operation to a switch I and solenoids 6 and 7 are connected for operation to a switch II. Solenoids 1 through 7 are operatively connected to a source of pressurized air, not shown, as indicated in FIGS. 1 and 3 through an inlet marked "IN" in each of the solenoids. Each of the solenoids can be exhausted through the exhaust port marked "EXH." in each of the solenoids. Solenoids 1 through 7 are controlled by switches I and II respectively, as will be described, for the purpose of controlling the dispensing and flushing system shown in FIGS. 1 and 3 to apply coating material from coating material supply A, or coating material from coating material supply C, to the gun 10 for deposition on a printed circuit board.

The solenoids are also respectively controlled to accommodate the flushing of this system by means of solvent from the solvent supply source B and subsequent drying by blowing air through the lines. It will be appreciated that the solenoids in the preferred embodiment thus act as air valves for selectively controlling the actuators to be described.

The system further includes three valves 22, 23 and 24, operated by respective actuators 25, 26 and 27. A further actuator 29 is connected to operate a valve 30. A pressure regulator 38 is connected between solenoids and the coating material supply A. Moreover, a pressure regulator 39 is operatively connected in line between solenoid 4 and the solvent supply B, and another pressure regulator 40 is operatively connected in line between solenoid 5 and the coating material supply C.

The actuators 25-27 and 29 are preferably air actuators of any suitable sort which receive air selectively from respective solenoids to control the coating material and solvent control valves with which they are operably connected.

Solenoids 1, 2 and 6 are four-way solenoids, while the solenoids 3, 4, 5 and 7 are three-way solenoids. Solenoids 1, 2 and 6 each have two outputs. Solenoids 1 and 2 have two outputs a, b, or c as noted, for controlling respective actuators 25, 26 and valves 22, 23. Solenoid 6 has two outputs for controlling actuator 27 and valve 24. Solenoids 3-5 and 7 have one output for pressurizing the material and solvent supplies A, B and C and the air dry flow (solenoid 7). The letters a, b and c are used illustratively in the drawing to further clarify the relation of switch, actuator and valve positions.

The preferred embodiment also includes a pump 42 for pumping material to the gun 10 at a desired pressure, and a heater 43 for heating the pumped material which is delivered to the gun 10 to an appropriate degree for deposition of coating on the printed circuit boards.

It will be appreciated that the switches, solenoids, actuators, valves, timers, pump and heater as described herein can be any off the shelf units suitable for carrying out the purposes described herein and are believed available from a large number of suppliers.

It will further be appreciated that solenoids 1, 2 and 6 are connected to the respective actuators 25, 26 and 27, each via two lines, as shown, while solenoids 3, 4 and 5 are connected to the respective coating material and solvent containers A, B and C, through single lines, as shown. Solenoid 7 is connected to the actuator 29 through an air line, which actuator is connected to the valve 30 for turning the valve accordingly.

Solenoid 1 is connected to actuator 25 via lines 51 and 52. Solenoid 2 is connected to actuator 26 via lines 53 and 54. Solenoid 3 is connected to the pressure regulator via line 55 and from there via line 56 to the supply of coating material A. Solenoid 4 is connected via line 57 to pressure regulator 39 and from there through line 58 to the solvent supply B. Solenoid 5 is connected through line 59 to pressure regulator 40 and from there through line 60 to the coating material supply C. Solenoid 6 is connected through lines 61 and 62 to the actuator 27; and solenoid 7 is connected through line 63 to the air actuator 29 and from there through line 64 to the valve 30.

The coating material supply A is connected to the "a" input of valve 22 via line 65. A line 66 extends from the output of valve 22 to the "ab" input of valve 23 and a line 67 from the output of valve 23 to a "T" fitting, T. A line 68 extends from the "T" fitting T to the pump 42. The pump is connected to the heater through a line 69 and the heater is connected to the gun 10 through the line 70.

A recirculation line 71 extends from the gun 10 to the valve 24 and from there via a line 72 to the "T" fitting T. The valve 24 is also connected through a line 73 to a solvent dump.

The solvent supply B is connected through a line 74 to the valve 30 and from there through a line 75 to the "T"-fitting, T-1. From the "T"-fitting T-1, a line 76 conducts solvent to the "b" input of valve 22, and also through a line 85 to valve 36. Coating material supply C is connected through a line 77 to the "c"0 input of valve 23. Finally, actuators 25, 26 and 27 are connected to the respective valves 22, 23 and 24 through suitable control links 78, 79 and 80 of pneumatic, hydraulic, electrical or mechanical form as is described.

It will be appreciated that these various connections, whether they are pneumatic or fluid lines or pneumatic, hydraulic, electronic or mechanical control links, are all shown very diagrammatically in FIGS. 1 and 3, any suitable and readily available lines, hoses, wires, electric or mechanical control links, could be used.

Accordingly, it will be appreciated that valve 23 constitutes a common valve means through which both coating materials and the solvent selectively flow. Lines 68, 69, 70 and 71 constitute a common conduit through which both coating material and solvent selectively flow. Valve 24 is a recirculation valve and line 72 may also, upon positioning of valve 24, constitute a common line through which the coating materials and solvent flow.

It should further be appreciated that valve 22 constitutes a second valve means common to the first coating material and solvent, but not to the second coating material.

Accordingly, all conduits and material, solvent and drying air sources are selectively interconnected by controllable valves so no manual disconnection and reconnection of lines or conduiting is required.

THE DOCKING CUP

The solvent docking cup 86 is diagrammatically illustrated on the left hand side of FIG. 1. Here, Switch III is connected to timer 33 via a control link "CL" and through timer 33 to timer 34. Timer 33 is connected through a solenoid 8 and line 81 to valve 35; and timer 34 is connected through a solenoid 9 and line 82 to valve 36. A line 83 connects valve 36 to the solvent docking cup 86, which is filled with solvent while the valve 35 connects a docking cup drain (not shown) through line 84 and 87 to a dump.

In the embodiment of FIG. 3 a docking cup 186 is shown and contains a substantially moisture-free inert gas. While other gases may be used, the preferred gas is nitrogen and is shown to be supplied from a nitrogen supply tank N. Nitrogen is supplied from the supply tank N through line 181, needle valve 136, and line 183 into the docking cup 186. The needle valve 136 allows nitrogen to be adjustable directed at a constant flow rate into the docking cup 186 to keep the environment in which the nozzle 18 is docked substantially dry. This prevents skin-over of residual coating material in the case in which moisture cure or secondary moisture cure coating materials are used.

In FIG. 3 the gun 10 is shown, in phantom, to be in its docked position with the nozzle extending through a diaphragm 187 and into the docking cup 186. The diaphragm 187 is made from a flexible material such as latex and includes a central aperture 188 into which the nozzle 18 is inserted. Thus, the diaphragm 187 generally seals the inside of the docking cup 186 from the outside environment. This general sealing effect allows some escape of gas in the small space between the nozzle 18 and the edge of the aperture 188. This allows nitrogen to be supplied at a constant low flow rate through the needle valve 136 and assures that outside air containing moisture will not enter the cup and cause the nozzle 18 to skin over.

It will be appreciated that any substantially moisture-free inert gas may be substituted for the nitrogen used in the preferred embodiment of the invention when using moisture cure or secondary moisture cure coating materials. The only requirements are that the gas neither have any adverse reaction nor contain moisture in amounts sufficient to cure the moisture cure or secondary moisture cure materials used in the system.

OPERATION OF THE DISPENSING AND FLUSHING SYSTEM

The operation of the foregoing apparatus and its various elements will be further apparent from the following description of the operation of the dispensing and flushing system. In order to supply coating material from the coating material supply A to the gun 10 for deposition on a circuit board, the switch I is set to the left position as shown in FIG. 1, energizing solenoids 1 and 3. In this position, solenoid 3 is actuated to deliver air pressure through pressure regulator 38, via lines 55 and 56, to the coating material supply A. The material supply is pressurized and exits the container through line 65 to the "a" input of two-way valve 22. Valve 22 is operable to conduct material from supply A into the line 66 by virtue of the fact that solenoid 1 has been actuated to control the actuator 25 and valve 22 to pass fluid from line 65 to line 66. Since solenoid 2 is presently de-energized, the air actuator 26 is likewise de-energized and valve 23 is set in its normal position, which allows coating material (A) to flow from line 66 into input, a, b, of valve 23 and out into line 67 through the "T" connection T to the line 68 and pump 42. The material is then pumped through heater 43 to the spray gun 10.

Material which is not sprayed through the spray gun 10 is circulated up through line 71 to the two-way valve 24. Since switch II currently is set at the "run" position, solenoid 6 is de-energized, as is actuator 27, so that valve 24 is in its normal position passing the nonsprayed coating material (A) to flow through valve 24 and line 72 to the "T" connection T and back into line 68 to the pump for recirculation.

When a coating run has been completed and material from supply A is to be flushed from the system, switch II is set to the purge position and switch I is set to its middle position (b, b) to select the solvent from solvent supply B. With switch II in the purge position, solenoid 6 is energized and actuator 27 switches valve 24 from its normal position to the flush position, to connect the return line 71 from gun 10 to line 73 and the dump. At the same time, switch I energizes solenoid 4, which applies air pressure through lines 57, regulator 39 and line 58 to the solvent reservoir B. This pushes solvent up to the valve 30 through line 74. At this time, the valve 30 and the valve 36 are maintained in a normal position, allowing solvent flow through lines 75 and 76, to valve 22.

Since solenoid 1 and air actuator 25 are not energized, the valve 3 has returned to its normal position. This allows solvent to pass through the input "b" of valve 22 into line 66 and through input "a, b" of valve 23, which is still in its unenergized normal position, to the "T" connection T, line 68, pump 42, line 69, heater 43, and line 70 to gun 10. Spray gun 10 can now be positioned in a docking cup 86 (which will be later described) or other reservoir to purge the gun briefly into the cup or reservoir. With the gun then closed, solvent flows through the return line 71 and through the valve 24 and line 73 to the dump. Switch II can be cycled between its "run" and "purge" positions to cycle solvent both through the recirculation loop and to the dump.

With now both the circulation loop and the valve 24 cleaned with solvent, switch II can now be set to the "air" position to energize solenoid 7. This pressurizes actuator 29 to turn valve 30, cutting off solvent flow and blowing air into lines 75 through input "b" of valve 22, into line 66, valve 23, lines 67, 68, the pump 42, heater 43, gun 10 and line 71, and from there through valve 24 and line 73 into the dump to dry the lines. Accordingly, the system is cleaned and dried. Again, switch II can be cycled between "run" and "purge" to dry line 72 and the recirculation loop.

When it is desired to select the alternate conformal coating material from container C, switch II is returned to the "run" position. Switch I is moved to the right-hand position (c, c), where it energizes solenoids 2 and 5. Solenoid 5 applies air pressure via lines 59 and 60 and pressure regulator 40, to the material supply C. This pushes material firm supply C through line 77 to input "c" of valve 23.

At the same time, solenoid 2 has energized air actuator 26. This moves valve 23 from its normal position to its energized position, to allow the material from the material supply C to pass through valve 23, line 67, the "T" connection T, and line 68 to the pump 42, heater 43 and gun 10. Material which is not applied through the spray gun enters the return line 71, passes through the valve 24, which is in its unenergized, normal position, through line 72 and then back through the "T" connection and to line 68 for recirculation.

OPERATION OF THE DOCKING CUP

The operation of the two embodiments of the docking cup will be further apparent from the following description of the operation taken in connection with FIGS. 1-3. Referring first to FIG. 2, a docking cup 86 containing solvent is shown as receiving the docked nozzle 18 in order to prevent any residual coating material on or in the nozzle 18 from skinning over. The gun nozzle 18 is parked in the docking cup 86 by the robot when the gun is either idled or being flushed. This docking cup 86 is provided in the coating enclosure adjacent to the circuit board coating area, for example, as indicated in FIG. 2.

More particularly, in the embodiment shown, docking cup 86 is mounted on frame 14 in a position proximate the circuit boards mounted for coating. The cup 86 is thus within any coating area enclosure and closely adjacent the normal movement pattern of the coating gun.

After a coating run and in order to prevent the nozzle 18 from skinning over, the robot moves the spray gun to immerse the nozzle 18 in the solvent contained in the docking cup 86. This removes coating material exposed to the air from the exterior of the nozzle to prevent skinning over.

Periodically, old solvent in the docking cup 86 is removed and fresh solvent added. In order to accomplish this, switch III is pushed momentarily to its "refill" position. This starts timer 33 which operates the valve 35 through solenoid 8 and line 81. Valve 35 is thus opened for a predetermined time to dump solvent from the cup 86 through lines 84 and 87 into the dump. Thereafter, the timer 33 times out, closes solenoid 8 and closes valve 35. Timer 34 then energizes solenoid 9 to operate valve 36 through line 82 to divert solvent from the line 75 through fitting "T-1" to the line 85 and thus line 83, to fill the cup for a predetermined period. Thereafter the timer times out and solenoid 9 closes valve 36. This is done, of course, during the time when the switch 1 is placed in its "intermediate" (solvent) position (b, b) and switch II is in its "run" or its "purge" position.

It will be appreciated of course, that the switches I, II and III can include any suitable plurality of ganged contacts to accomplish the functions as noted above. Accordingly, and if desired, the system can be run so that solvent is driven both through the recirculation loop comprising lines 71, 72, 68, 69 and 70; or through the valve 24 through lines 73 to the dump. At the same time and while the solvent supply B is pressurized, the switch III can be operated to dump and to fill the solvent cup 86, where the spray gun 10 can be docked when it is idled in order to prevent material skin-over. Also it will be appreciated that after a run involving coating material C, the switches I and II can be placed in appropriate positions to purge and dry the lines from the two-way valve 23 to the dump line 73 of any coating material C therein.

Thus it will be appreciated that the purge and dry operations serve to flush and dry at least all common material lines through which two or more materials might flow. It will also be appreciated that additional coating materials in excess of two could be accommodated with the addition of further valves, supplies and supply lines.

In the case of using moisture cure and secondary moisture cure materials, the second embodiment of the docking cup is utilized. In this case, instead of the docking cup being filled with a solvent it is filled with a dry gas such as nitrogen. This nitrogen docking cup 186 is shown diagrammatically on the lefthand side of FIG. 3. It should be noted that the mechanical connections and positioning of the docking cup on the frame 14, as shown in FIG. 2 and previously described, are the same in each embodiment of the docking cup and therefore will not be further described.

After a coating run involving moisture cure or secondary moisture cure materials and in order to prevent the nozzle 18 from skinning over, the gun 18 is first purged of any solvent and air-dried. The robot then moves the spray gun to dock the nozzle 18 in the nitrogen docking cup 186 to prevent the nozzle 18 from skinning over. The dry environment of the nitrogen cup 186 prevents moisture from contacting the nozzle 18 and causing skin over of the moisture cure or secondary moisture cure materials. The needle valve 136 is left open for as long as the gun 10 is docked in the cup 186. During this docking period nitrogen constantly flows into the docking cup 186 and is allowed to slowly escape in the space created between the nozzle 18 and the edge of the aperture 188. As in the case of the solvent docking cup 86 the gun 10 is docked in the nitrogen docking cup 186 anytime the gun 10 is idled and residual coating material exists on the nozzle 18.

While the invention has been described with reference to preferred embodiments, it will be understood by those skilled in the art that various changes may be made and equivalents may be substituted for elements thereof without departing from the scope of the invention. In addition, many modifications could be made to adapt a particular situation or material to the teachings of the invention without departing from the essential scope thereof. Therefore, it is intended that the invention not be limited to the particular embodiments disclosed, but that the invention will include all embodiments falling within the scope of the appended claims.

I claim:

1. In a system for coating printed circuit boards, including a coating applicator gun having a nozzle, at least two sources of different coating materials at least one of which is moisture curable, at least one source of a purging solvent material, and means for selectively conducting said different coating materials to said gun at different times, said means including common conduits and valves, the method of coating printed circuit boards and changing over from one coating material to the other, including the steps of:
   conducting a first flow of a first coating material from a source thereof to said gun for coating a printed circuit board,
   selectively discontinuing said flow,
   docking said gun nozzle in a cup containing a substantially moisture-free inert gas to prevent skin-over of residual material on said nozzle,
   conducting a second flow of a second coating material from a source thereof to said gun for coating a printed circuit board, and
   before conducting said second flow, purging all common material conduits by conducting a flow of solvent therethrough from a solvent source.

2. The method of claim 1 wherein the docking step further comprises docking said gun in a cup containing nitrogen gas.

3. The method of claim 1 including the step of blowing solvent drying air through said common conduits prior to conducting said second flow.

4. The method of claim 1 wherein said first coating material is conducted to said gun through a common valve means and a second valve means, and wherein said second coating material is conducted to said gun through said second common valve means, the purging step comprising conducting solvent through both said common and second valve means.

5. The method of claim 4 wherein said system includes a two way recirculating valve, in one position closing a recirculation loop for conducting material around such recirculation loop back through said gun, and in another position opening a recirculating line from said gun to a dump, the method comprising the purging step of flowing solvent through said recirculation valve when said valve closes said loop to flush said loop and when said valve opens said loop to dump solvent from said system.

6. The method of claim 5, including the step of flowing solvent drying air through said recirculation valve when in a position opening said recirculation loop.

7. In a method for coating printed circuit boards including a coating applicator gun having a nozzle and means to deliver a coating material to said nozzle for application to a circuit board, the method of preventing skin-over of residual moisture curable coating material on said nozzle between coating applications including the step of:
   docking said nozzle in a container holding a substantially moisture-free inert gas.

8. The method of claim 7 wherein the docking step further comprises docking said nozzle in a container containing nitrogen gas and being generally sealed against contamination by air in the environment outside the container.

9. In a system for coating printed circuit boards with at least one of at least two moisture curable coating materials and for changing over between coating materials supplied selectively to an applicator gun, said apparatus comprising:
   a first supply of a first moisture curable coating material;
   a second supply of a second moisture curable coating material;
   a solvent supply;
   first coating material conduit means for conducting said one moisture curable coating material to said gun;
   second coating material conduit means for conducting said second moisture curable coating material to said gun;
   solvent conduit means for conducting solvent to said gun;
   all said conduit means having a common valve means between said supplies and said gun, and said conduit means comprising a common conduit between said common valve means and said gun; and,
   gun receiving container means for holding a substantially moisture-free inert gas and preventing skin-over of said first and second moisture curable coating materials on said gun.

10. Apparatus as in claim 9 wherein said container means further includes flexible diaphragm means having aperture means for receiving said gun and generally sealing the container to prevent escape of said gas.

11. Apparatus as in claim 10 further comprising valve means and gas supply means for supplying said inert gas to said container means, wherein said valve means is connected between said supply means and said container means and allows a continuous, adjustable flow of said inert gas to be directed from said gas supply means into said container means.

12. Apparatus as in claim 9 further including a second valve means common to said first coating material conduit means and said solvent conduit means, but not to said second coating material conduit means, said second valve means having selective inputs operably connected to said first supply of one coating material and said solvent supply and an output connected to said common valve means.

13. Apparatus as in claim 12 further including a recirculation valve means operable in one position to recirculate flowing coating material from said gun back to said gun and in another position to direct flow of coating material or solvent to a dump.

14. Apparatus as in claim 13 further including means for directing solvent drying air into said solvent conduit means upstream of said second valve means.

15. Apparatus as in claim 14 further including first, second and third valve actuator and respective actuator control means for operating said common valve means, said second valve means and said recirculation valve means, respectively.

16. Apparatus as in claim 15 including fourth, fifth and sixth valve means for pressurizing first and second material coating supplies and said solvent supply, respectively to selectively cause said coating materials and said solvent to flow from said respective supplies to said gun.

17. Apparatus as in claim 16 further including a seventh valve means for directing air into said solvent conduit means and said common conduit.

18. In a system for applying a coating material to printed circuit boards with an applicator gun having a nozzle for depositing a moisture curable coating material onto printed circuit boards during a coating operation, apparatus for preventing skin-over of residual coating material on said nozzle between coating material applications, said apparatus comprising: container means disposed in a position proximate the location of said coating applications for receiving said nozzle and for holding a substantially moisture-free inert gas for preventing skin-over of residual coating material on said nozzle.

19. Apparatus as in claim 18 wherein said system includes a frame for mounting said circuit boards for coating and said container means, wherein said container means is mounted on said frame in a position to receive said nozzle therein between coating applications.

20. Apparatus as in claim 19 wherein said inert gas is nitrogen.

21. Apparatus as in claim 20 wherein said system includes a means for flushing the coating material from the system with a solvent and wherein said apparatus further includes a nitrogen supply means connected to a valve means for directing a continuous, adjustable flow of nitrogen into said container means.

22. Apparatus as in claim 18 wherein said container means comprises a cup having a flexible diaphragm secured across the top of said cup, said diaphragm having an aperture for receiving a tip portion of said gun thereby generally sealing said container from the outside environment.

23. In a system for coating printed circuit boards with at least one moisture curable coating material and for cleaning said system, between coating applications, of coating material supplied selectively to an applicator gun, said apparatus comprising:
a first supply of one coating material;
a solvent supply;
first coating material conduit means for conducting said one coating material to said gun;
solvent conduit means for conducting solvent to said gun;
all said conduit means having a common valve means between said supplies and said gun, and said conduit means comprising a common conduit between said common valve means and said gun; and,
gun receiving container means holding a substantially moisture-free inert gas for preventing skin-over of coating material on said gun.

24. Apparatus as in claim 23 wherein said inert gas is nitrogen.

25. Apparatus as in claim 23 further comprising valve means and gas supply means for supplying said inert gas, wherein said valve means is connected between said supply means and said gun receiving means and directs a continuous, adjustable flow of said inert gas from said gas supply means into said gun receiving container means.

26. Apparatus as in claim 25 wherein said gun receiving container means comprises a container having an open top and a flexible diaphragm secured across said open top, said diaphragm having an aperture for receiving a tip portion of said gun and thereby generally sealing said container from the outside environment.

27. Apparatus as in claim 23 further including a recirculation valve means operable in one position to recirculate flowing coating material from said gun back to said gun and in another position to direct flow of coating material or solvent to a dump.

28. Apparatus as in claim 23 further including means for directing solvent drying air into said solvent conduit means upstream of said common valve means.

29. In a system for coating printed circuit boards, including a coating applicator gun having a nozzle, at least one source of moisture curable coating material, at least one source of a purging solvent material, and means for selectively conducting said coating material and said solvent material to said gun at different times, said means including common conduits and valves, a method of coating printed circuit boards and cleaning said system between applications, including the steps of:
conducting a first flow of a coating material from a source thereof to said gun for coating a printed circuit board,
selectively discontinuing said flow,
purging all common material conduits and common valves by conducting a flow of solvent therethrough from a solvent source; and,
docking said gun nozzle in a cup containing a substantially moisture-free inert gas between coating applications to prevent skin-over of residual coating material on said nozzle.

30. The method of claim 29 wherein said docking step further comprises docking said nozzle in a generally sealed cup of nitrogen, said nitrogen flowing into said cup at a constant flow rate.

31. The method of claim 29 including the step of blowing solvent drying air through said common conduits and valves prior to docking said gun nozzle.

32. The method of claim 29 wherein said system includes a two way recirculating valve, in one position closing a recirculation loop back through said gun, and in another position opening a recirculating line from said gun to a dump, the method comprising the purging step of flowing solvent through said recirculation valve when said valve closes said loop to flush said loop and when said valve opens said loop to dump solvent from said system.

33. The method of claim 32, including the step of flowing solvent drying air through said recirculation valve when in a position opening said recirculation loop.

34. In a system for coating printed circuit boards, including a coating applicator gun having a nozzle, at least two sources of different coating materials, at least one source of a purging solvent material, and means for selectively conducting said different coating materials to said gun at different times, said means including common conduits and valves, the method of coating printed circuit boards and changing over from one coating material to the other, including the steps of:
   conducting a first flow of a first coating material from a source thereof to said gun for coating a printed circuit board,
   selectively discontinuing said flow,
   purging all common material conduits by conducting a flow of solvent therethrough from a solvent source,
   docking said gun nozzle in a cup containing a solvent to prevent skin-over of residual material on said nozzle, and
   removing said nozzle from said cup and conducting a second flow of a second coating material from a source thereof to said gun for coating a printed circuit board.

35. The method of claim 34 including the step of blowing solvent drying air through said common conduits prior to conducting said second flow 36. The method of claim 34 including the step of periodically emptying and refilling said cup with solvent from said solvent source.

37. In a system for coating printed circuit boards, including a coating applicator gun, at least two sources of different coating materials, at least one source of a purging solvent material, and means for selectively conducting said different coating materials to said gun at different times, said means including common conduits and valves, the method of coating printed circuit boards and changing over from one coating material to the other, including the steps of:
   conducting a first flow of a first coating material from a source thereof to said gun for coating a printed circuit board,
   selectively discontinuing said flow,
   conducting a second flow of a second coating material from a source thereof to said gun for coating a printed circuit board, and
   before conducting said second flow, purging all common material conduits by conducting a flow of solvent therethrough from a solvent source,
   wherein said first coating material is conducted to said gun through a common valve means and a second valve means, and wherein said second coating material is conducted to said gun through said second common valve means, the purging step comprising conducting solvent through both said common and second valve means.

38. The method of claim 37 wherein said system includes a two way recirculating valve, in one position closing a recirculation loop for conducting material around such recirculation loop back through said gun, and in another position opening a recirculating line from said gun to a dump, the method comprising the purging step of flowing solvent through said recirculation valve when said valve closes said loop to flush said loop and when said valve opens said loop to dump solvent from said system.

39. The method of claim 38, including the step of flowing solvent drying air through said recirculation valve when in a position opening said recirculation loop.

40. In a system for coating printed circuit boards including a coating applicator gun having a nozzle, means to deliver a coating material to said nozzle for application to a circuit board, at least respective supplies of two coating materials and a solvent supply for purging the system between coating material change over, a method of preventing skin-over of residual coating material on said nozzle between coating applications including the steps of:
   purging the system with solvent from said solvent supply, and
   docking said nozzle within a coating material solvent bath means between coating applications.

41. A method as in claim 40 including the further step of selectively voiding solvent from said bath means and replenishing said bath means with fresh solvent.

42. A method as in claim 41 wherein said solvent bath means is replenished with fresh solvent from said solvent supply.

43. A method as in claim 42 including the step of automatically controlling the voiding and replenishing of said bath means through timer actuated valves connected respectively between said solvent bath means and a dump and between said solvent supply and said solvent bath means.

44. In a system for coating printed circuit boards with at least one of at least two coating materials and for changing over between coating materials supplied selectively to an applicator gun, said apparatus comprising:
   a first supply of one coating material;
   a second supply of a second coating material;
   a solvent supply;
   first coating material conduit means for conducting said one coating material to said gun;
   second coating material conduit means for conducting said second coating material to said gun;
   solvent conduit means for conducting solvent to said gun;
   all said conduit means having a common valve means between said supplies and said gun, and said conduit means comprising a common conduit between said common valve means and said gun; and, a second valve means common to said first coating material conduit means and said solvent conduit means, but not to said second coating material conduit means, said second valve means having selective inputs operably connected to said first supply of one coating material and said solvent supply and an output connected to said common valve means.

45. Apparatus as in claim 44 further including a recirculation valve means operable in one position to recirculate flowing coating material from said gun back to said gun and in another position to direct flow of coating material or solvent to a dump.

46. Apparatus as in claim 45 further including means for directing solvent drying air into said solvent conduit means upstream of said second valve means.

47. Apparatus as in claim 46 further including first, second and third valve actuator and respective actuator control means for operating said common valve means, said second valve means and said recirculation valve means, respectively.

48. Apparatus as in claim 47 including fourth, fifth and sixth valve means for pressurizing first and second material coating supplies and said solvent supply, respectively to selectively cause said coating materials and said solvent to flow from said respective supplies to said gun.

49. Apparatus as in claim 48 further including a seventh valve means for directing air into said solvent conduit means and said common conduit.

50. Apparatus as in claim 49 further including a gun receiving solvent bath means for preventing skin-over of coating material on said gun, a bath means refill valve operatively connected to said solvent conduit means for directing solvent to said bath means;
a bath means dump valve; and
means for automatically controlling said bath means refill valve and said bath means dump valve to evacuate and to refill said bath means with solvent from said solvent supply.

51. In a system for applying a coating material to printed circuit boards with an applicator gun having a nozzle for depositing a coating material onto printed circuit boards during a coating operating and a means for flushing the coating material from the system with a solvent, apparatus for preventing skin-over of residual coating material on said nozzle between coating material applications, said apparatus comprising: a solvent bath means disposed in a position proximate the location of said coating applications for receiving said nozzle in immersion to prevent skin-over of residual coating material thereon.

52. Apparatus as in claim 51 wherein said system includes a frame for mounting said circuit boards for coating and a solvent cup for containing said bath, said cup being mounted on said frame in a position to receive said nozzle in said bath between coating applications.

53. Apparatus as in claim 52 wherein said apparatus further includes valve means for selectively emptying and filling said cup with solvent from said system.

54. In a system for coating printed circuit boards with at least one coating material and for cleaning said system, between coating applications, of coating material supplied selectively to an applicator gun, said apparatus comprising:
a first supply of one coating material;
a solvent supply;
first coating material conduit means for conducting said one coating material to said gun;
solvent conduit means for conducting solvent to said gun;
all said conduit means having a common valve means between said supplies and said gun, and said conduit means comprising a common conduit between said common valve means and said gun, and
a recirculation valve means operable in one position to recirculate flowing coating material from said gun back to said gun and in another position to direct flow of coating material or solvent to a dump.

55. Apparatus as in claim 54 further including means for directing solvent drying air into said solvent conduit means upstream of said common valve means.

56. In a system for coating printed circuit boards with at least one coating material and for cleaning said system, between coating applications, of coating material supplied selectively to an applicator gun, said apparatus comprising:
a first supply of one coating material;
a solvent supply;
first coating material conduit means for conducting said one coating material to said gun;
solvent conduit means for conducting solvent to said gun;
all said conduit means having a common valve means between said supplies and said gun, and said conduit means comprising a common conduit between said common valve means and said gun;
a gun receiving solvent bath means for preventing skin-over of coating material on said gun, a bath means refill valve operatively connected to said solvent conduit means for directing solvent to said bath means;
a bath means dump valve; and
means for automatically controlling said bath means refill valve and said bath means dump valve to evacuate and to refill said bath means with solvent from said solvent supply.

57. Apparatus as in claim 56 further including means for directing solvent drying air into said solvent conduit means upstream of said common valve means.

58. In a system for coating printed circuit boards, including a coating applicator gun having a nozzle, at least one source of coating material, at least one source of a purging solvent material, and means for selectively conducting said coating material and said solvent material to said gun at different times, said means including common conduits and valves, a method of coating printed circuit boards and cleaning said system between applications, including the steps of:
conducting a first flow of a coating material from a source thereof to said gun for coating a printed circuit board,
selectively discontinuing said flow,
purging all common material conduits and common valves by conducting a flow of solvent therethrough from a solvent source, and
docking said gun nozzle in a cup containing a solvent between coating applications to prevent skin-over of residual material on said nozzle.

59. The method of claim 58 including the step of blowing solvent drying air through said common conduits and valves prior to conducting a second coating application.

60. The method of claim 58 including the step of periodically emptying and refilling said cup with solvent from said solvent source.

61. In a system for coating printed circuit boards including a coating applicator gun, at least one source of coating material, at least one source of a purging solvent material, a two way recirculating valve, in one position closing a recirculation loop for conducting material around such recirculation loop back through said gun, and in another position opening a recirculating line from said gun to a dump, and means for selectively conducting said coating material and said solvent material to said gun at different times, said means including common conduits and valves, a method of coating printed circuit boards and cleaning said system between applications, including the steps of:

conducting a first flow of a coating material from a source thereof to said gun for coating a printed circuit board, selectively discontinuing said flow, purging all common material conduits and common valves by conducting a flow of solvent therethrough from a solvent source, and flowing solvent through said recirculation valve when said valve closes said loop to flush said loop and when said valve opens said loop to dump solvent from said system.

62. The method of claim 61, including the step of flowing solvent drying air through said recirculation valve when in a position opening and recirculation loop.

* * * * *